United States Patent
Levy et al.

(10) Patent No.: US 12,266,521 B2
(45) Date of Patent: Apr. 1, 2025

(54) OXIDE-NITRIDE-OXIDE STACK HAVING MULTIPLE OXYNITRIDE LAYERS

(71) Applicant: LONGITUDE FLASH MEMORY SOLUTIONS LTD., Dublin (IE)

(72) Inventors: Sagy Charel Levy, Zichron Yaakov (IL); Krishnaswamy Ramkumar, San Jose, CA (US); Fredrick Jenne, Mountain House, CA (US); Sam G. Geha, Cupertino, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 4 days.

(21) Appl. No.: 17/945,793

(22) Filed: Sep. 15, 2022

(65) Prior Publication Data

US 2023/0017648 A1    Jan. 19, 2023

Related U.S. Application Data

(60) Division of application No. 17/157,704, filed on Jan. 25, 2021, now abandoned, which is a continuation of
(Continued)

(51) Int. Cl.
  *H01L 21/02* (2006.01)
  *C23C 16/02* (2006.01)
  (Continued)

(52) U.S. Cl.
  CPC ...... *H01L 21/0214* (2013.01); *C23C 16/0272* (2013.01); *C23C 16/308* (2013.01);
  (Continued)

(58) Field of Classification Search
  CPC ........... H01L 21/0214; H01L 21/02148; H01L 21/022; H01L 21/02211; H01L 21/02271;
  (Continued)

(56) References Cited

U.S. PATENT DOCUMENTS

| 4,257,832 A | 3/1981 | Schwabe et al. |
| 4,395,438 A | 7/1983 | Chiang |

(Continued)

FOREIGN PATENT DOCUMENTS

| CN | 1107254 A | 8/1995 |
| CN | 1400669 A | 3/2003 |

(Continued)

OTHER PUBLICATIONS

10GEA, "10 Gigabit Ethernet Technology Overview White Paper", 10 Gigabit Ethernet Alliance, Revision 1.0, May 2001, pp. 1-22.
(Continued)

*Primary Examiner* — Mohammad M Choudhry
(74) *Attorney, Agent, or Firm* — Michael Bartholomew

(57) ABSTRACT

A semiconductor device including an oxide-nitride-oxide (ONO) structure having a multi-layer charge storing layer and methods of forming the same are provided. Generally, the method involves: (i) forming a first oxide layer of the ONO structure; (ii) forming a multi-layer charge storing layer comprising nitride on a surface of the first oxide layer; and (iii) forming a second oxide layer of the ONO structure on a surface of the multi-layer charge storing layer. Preferably, the charge storing layer comprises at least two silicon oxynitride layers having differing stoichiometric compositions of Oxygen, Nitrogen and/or Silicon. More preferably, the ONO structure is part of a silicon-oxide-nitride-oxide-silicon (SONOS) structure and the semiconductor device is a SONOS memory transistor. Other embodiments are also disclosed.

16 Claims, 4 Drawing Sheets

Related U.S. Application Data application No. 15/099,025, filed on Apr. 14, 2016, now Pat. No. 10,903,068, which is a continuation of application No. 13/917,500, filed on Jun. 13, 2013, now Pat. No. 9,355,849, which is a continuation of application No. 11/811,958, filed on Jun. 13, 2007, now abandoned.

(60) Provisional application No. 60/931,947, filed on May 25, 2007.

(51) Int. Cl.
*C23C 16/30* (2006.01)
*G11C 16/04* (2006.01)
*H01L 21/28* (2006.01)
*H01L 21/314* (2006.01)
*H01L 29/51* (2006.01)
*H01L 29/792* (2006.01)
*H10B 43/30* (2023.01)
*H01L 29/78* (2006.01)

(52) U.S. Cl.
CPC .... *G11C 16/0466* (2013.01); *H01L 21/02148* (2013.01); *H01L 21/022* (2013.01); *H01L 21/02211* (2013.01); *H01L 21/02271* (2013.01); *H01L 21/3145* (2013.01); *H01L 29/40117* (2019.08); *H01L 29/518* (2013.01); *H01L 29/792* (2013.01); *H10B 43/30* (2023.02); *H01L 21/02164* (2013.01); *H01L 21/02238* (2013.01); *H01L 21/02255* (2013.01); *H01L 29/7833* (2013.01)

(58) Field of Classification Search
CPC .......... H01L 21/3145; H01L 29/40117; H01L 29/518; H01L 29/792; H01L 21/02164; H01L 21/02238; H01L 21/02255; H01L 29/7833; C23C 16/0272; C23C 16/308; G11C 16/0466; H10B 43/30
See application file for complete search history.

(56) References Cited

U.S. PATENT DOCUMENTS

| | | |
|---|---|---|
| 4,490,900 A | 1/1985 | Chiu |
| 4,543,707 A | 10/1985 | Ito et al. |
| 4,667,217 A | 5/1987 | Janning |
| 4,843,023 A | 6/1989 | Chiu et al. |
| 4,870,470 A | 9/1989 | Bass, Jr. et al. |
| 5,179,038 A | 1/1993 | Kinney et al. |
| 5,348,903 A | 9/1994 | Pfiester et al. |
| 5,404,791 A | 4/1995 | Kervagoret |
| 5,405,791 A | 4/1995 | Ahmad et al. |
| 5,408,115 A | 4/1995 | Chang |
| 5,464,783 A | 11/1995 | Kim et al. |
| 5,500,816 A | 3/1996 | Kobayashi |
| 5,543,336 A | 8/1996 | Enami et al. |
| 5,550,078 A | 8/1996 | Sung |
| 5,573,963 A | 11/1996 | Sung |
| 5,773,343 A | 6/1998 | Lee et al. |
| 5,793,089 A | 8/1998 | Fulford, Jr. et al. |
| 5,817,170 A | 10/1998 | Desu et al. |
| 5,847,411 A | 12/1998 | Moril |
| 5,861,347 A | 1/1999 | Maiti et al. |
| 5,937,323 A | 8/1999 | Orczyk et al. |
| 5,939,333 A | 8/1999 | Hurley et al. |
| 5,972,765 A | 10/1999 | Clark et al. |
| 5,972,804 A | 10/1999 | Tobin et al. |
| 6,001,713 A | 12/1999 | Ramsbey et al. |
| 6,015,739 A | 1/2000 | Gardner et al. |
| 6,020,606 A | 2/2000 | Liao |
| 6,023,093 A | 2/2000 | Gregor et al. |
| 6,025,267 A | 2/2000 | Pey et al. |
| 6,074,915 A | 6/2000 | Chen et al. |
| 6,114,734 A | 9/2000 | Eklund |
| 6,127,227 A | 10/2000 | Lin et al. |
| 6,136,654 A | 10/2000 | Kraft et al. |
| 6,140,187 A | 10/2000 | DeBusk et al. |
| 6,147,014 A | 11/2000 | Lyding et al. |
| 6,150,286 A | 11/2000 | Sun et al. |
| 6,153,543 A | 11/2000 | Chesire et al. |
| 6,157,426 A | 12/2000 | Gu |
| 6,162,700 A | 12/2000 | Hwang et al. |
| 6,174,758 B1 | 1/2001 | Nachumovsky |
| 6,174,774 B1 | 1/2001 | Lee |
| 6,214,689 B1 | 4/2001 | Lim et al. |
| 6,217,658 B1 | 4/2001 | Orczyk et al. |
| 6,218,700 B1 | 4/2001 | Papadas |
| 6,268,299 B1 | 7/2001 | Jammy et al. |
| 6,277,683 B1 | 8/2001 | Pradeep et al. |
| 6,287,913 B1 | 9/2001 | Angello et al. |
| 6,297,096 B1 | 10/2001 | Boaz |
| 6,297,173 B1 | 10/2001 | Tobin et al. |
| 6,321,134 B1 | 11/2001 | Henley et al. |
| 6,335,288 B1 | 1/2002 | Kwan et al. |
| 6,348,380 B1 | 2/2002 | Weimer et al. |
| 6,365,518 B1 | 4/2002 | Let et al. |
| 6,399,484 B1 | 6/2002 | Yamasaki et al. |
| 6,406,960 B1 | 6/2002 | Hopper et al. |
| 6,429,081 B1 | 8/2002 | Doong et al. |
| 6,433,383 B1 | 8/2002 | Ramsbey et al. |
| 6,440,797 B1 | 8/2002 | Wu et al. |
| 6,444,521 B1 | 9/2002 | Chang et al. |
| 6,445,030 B1 | 9/2002 | Wu et al. |
| 6,461,899 B1 | 10/2002 | Kitakado et al. |
| 6,462,370 B2 | 10/2002 | Kuwazawa |
| 6,468,927 B1 | 10/2002 | Zhang et al. |
| 6,469,343 B1 | 10/2002 | Miura et al. |
| 6,518,113 B1 | 2/2003 | Buynoski |
| 6,559,026 B1 | 5/2003 | Rossman et al. |
| 6,573,149 B2 | 6/2003 | Kizilyalli et al. |
| 6,586,343 B1 | 7/2003 | Ho et al. |
| 6,586,349 B1 | 7/2003 | Jeon et al. |
| 6,596,590 B1 | 7/2003 | Miura et al. |
| 6,599,795 B2 | 7/2003 | Ogata |
| 6,602,771 B2 | 8/2003 | Inoue et al. |
| 6,610,614 B2 | 8/2003 | Niimi et al. |
| 6,624,090 B1 | 9/2003 | Yu et al. |
| 6,661,065 B2 | 12/2003 | Kunikiyo |
| 6,670,241 B1 | 12/2003 | Kamal et al. |
| 6,677,213 B1 | 1/2004 | Ramkumar et al. |
| 6,709,928 B1 | 3/2004 | Jenne et al. |
| 6,713,127 B2 | 3/2004 | Subramony et al. |
| 6,717,860 B1 | 4/2004 | Fujiwara |
| 6,730,566 B2 | 5/2004 | Niimi et al. |
| 6,746,968 B1 | 6/2004 | Tseng et al. |
| 6,768,160 B1 | 7/2004 | Li et al. |
| 6,768,856 B2 | 7/2004 | Akwani et al. |
| 6,774,433 B2 | 8/2004 | Lee et al. |
| 6,787,419 B2 | 9/2004 | Chen et al. |
| 6,818,558 B1 | 11/2004 | Rathor et al. |
| 6,833,582 B2 | 12/2004 | Mine et al. |
| 6,835,621 B2 | 12/2004 | Yoo et al. |
| 6,867,118 B2 | 3/2005 | Noro |
| 6,884,681 B1 | 4/2005 | Kamal et al. |
| 6,903,422 B2 | 6/2005 | Goda et al. |
| 6,906,390 B2 | 6/2005 | Nomoto et al. |
| 6,912,163 B2 | 6/2005 | Zheng et al. |
| 6,913,961 B2 | 7/2005 | Hwang |
| 6,917,072 B2 | 7/2005 | Noguchi et al. |
| 6,946,349 B1 | 9/2005 | Lee et al. |
| 6,958,511 B1 | 10/2005 | Halliyal et al. |
| 7,012,299 B2 | 3/2006 | Mahajani et al. |
| 7,015,100 B1 | 3/2006 | Lee et al. |
| 7,018,868 B1 | 3/2006 | Yang et al. |
| 7,033,890 B2 | 4/2006 | Shone |
| 7,033,957 B1 | 4/2006 | Shiraiwa et al. |
| 7,042,054 B1 | 5/2006 | Ramkumar et al. |
| 7,045,424 B2 | 5/2006 | Kim et al. |
| 7,060,594 B2 | 6/2006 | Wang |
| 7,084,032 B2 | 8/2006 | Crivelli et al. |
| 7,098,154 B2 | 8/2006 | Yoneda |

(56) References Cited

U.S. PATENT DOCUMENTS

| | | |
|---|---|---|
| 7,112,486 B2 | 9/2006 | Cho et al. |
| 7,115,469 B1 | 10/2006 | Halliyal et al. |
| 7,172,940 B1 | 2/2007 | Chen et al. |
| 7,189,606 B2 | 3/2007 | Wang et al. |
| 7,230,294 B2 | 6/2007 | Lee et al. |
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,279,740 B2 | 10/2007 | Bhattacharyya et al. |
| 7,301,185 B2 | 11/2007 | Chen et al. |
| 7,312,496 B2 | 12/2007 | Hazama |
| 7,315,474 B2 | 1/2008 | Lue |
| 7,323,742 B2 | 1/2008 | Georgescu |
| 7,338,869 B2 | 3/2008 | Fukuda et al. |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,425,491 B2 | 9/2008 | Forbes |
| 7,450,423 B2 | 11/2008 | Lai et al. |
| 7,463,530 B2 | 12/2008 | Lue et al. |
| 7,479,425 B2 | 1/2009 | Ang et al. |
| 7,482,236 B2 | 1/2009 | Lee et al. |
| 7,521,751 B2 | 4/2009 | Fujiwara |
| 7,535,053 B2 | 5/2009 | Yamazaki |
| 7,576,386 B2 | 8/2009 | Lue et al. |
| 7,544,565 B2 | 9/2009 | Kwak et al. |
| 7,588,986 B2 | 9/2009 | Jung |
| 7,601,576 B2 | 10/2009 | Suzuki et al. |
| 7,612,403 B2 | 11/2009 | Bhattacharyya |
| 7,636,257 B2 | 12/2009 | Lue |
| 7,642,585 B2 | 1/2010 | Wang et al. |
| 7,646,041 B2 | 1/2010 | Chae et al. |
| 7,646,637 B2 | 1/2010 | Liao |
| 7,670,963 B2 | 3/2010 | Ramkumar et al. |
| 7,688,626 B2 | 3/2010 | Lue et al. |
| 7,692,246 B2 | 4/2010 | Dreeskornfeld et al. |
| 7,713,810 B2 | 5/2010 | Hagemeyer et al. |
| 7,714,379 B2 | 5/2010 | Lee |
| 7,723,789 B2 | 5/2010 | Lin et al. |
| 7,737,488 B2 | 6/2010 | Lai et al. |
| 7,790,516 B2 | 9/2010 | Willer et al. |
| 7,811,890 B2 | 10/2010 | Hsu et al. |
| 7,879,738 B2 | 2/2011 | Wang |
| 7,910,429 B2 | 3/2011 | Dong et al. |
| 7,927,951 B2 | 4/2011 | Kim et al. |
| 7,948,799 B2 | 5/2011 | Lue et al. |
| 7,972,930 B2 | 7/2011 | Jang et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,071,453 B1 | 12/2011 | Rumkumar et al. |
| 8,093,128 B2 | 1/2012 | Koutny, Jr. et al. |
| 8,143,129 B2 | 3/2012 | Rumkumar et al. |
| 8,163,660 B2 | 4/2012 | Puchner et al. |
| 8,222,688 B1 | 7/2012 | Jenne et al. |
| 8,264,028 B2 | 9/2012 | Lue et al. |
| 8,283,261 B2 | 10/2012 | Rumkumar |
| 8,315,095 B2 | 11/2012 | Lue et al. |
| 8,318,608 B2 | 11/2012 | Rumkumar et al. |
| 8,482,052 B2 | 7/2013 | Lue et al. |
| 8,633,537 B2 | 1/2014 | Polishchuk et al. |
| 8,643,124 B2 | 2/2014 | Levy et al. |
| 8,710,578 B2 | 4/2014 | Jenne et al. |
| 8,859,374 B1 | 10/2014 | Polishchuk et al. |
| 8,860,122 B1 | 10/2014 | Polishchuk et al. |
| 8,940,645 B2 | 1/2015 | Rumkumar et al. |
| 8,993,453 B1 | 3/2015 | Rumkumar et al. |
| 9,093,318 B2 | 7/2015 | Polishchuk et al. |
| 9,306,025 B2 | 4/2016 | Polishchuk et al. |
| 9,349,824 B2 | 5/2016 | Levy et al. |
| 9,355,849 B1 | 5/2016 | Levy et al. |
| 9,449,831 B2 | 9/2016 | Levy et al. |
| 9,502,543 B1 | 11/2016 | Polishchuk et al. |
| 9,929,240 B2 | 3/2018 | Polishchuk et al. |
| 10,304,968 B2 | 5/2019 | Ramkumar et al. |
| 10,593,812 B2 | 3/2020 | Ramkumar et al. |
| 2001/0052615 A1 | 12/2001 | Fujiwara |
| 2002/0020890 A1 | 2/2002 | Willer |
| 2002/0048200 A1 | 4/2002 | Kuwazawa |
| 2002/0048893 A1 | 4/2002 | Kizilyalli et al. |
| 2002/0109138 A1 | 8/2002 | Forbes |
| 2002/0141237 A1 | 10/2002 | Goda et al. |
| 2002/0154878 A1 | 10/2002 | Akwani et al. |
| 2003/0030100 A1 | 2/2003 | Lee et al. |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0169629 A1 | 9/2003 | Goebel et al. |
| 2003/0183869 A1 | 10/2003 | Crivelli et al. |
| 2003/0222293 A1 | 12/2003 | Noro |
| 2003/0227049 A1 | 12/2003 | Sakakibara |
| 2003/0227056 A1 | 12/2003 | Wang et al. |
| 2004/0067619 A1 | 4/2004 | Niimi et al. |
| 2004/0071030 A1 | 4/2004 | Goda et al. |
| 2004/0094793 A1 | 4/2004 | Noguchi et al. |
| 2004/0104424 A1 | 6/2004 | Yamazaki |
| 2004/0129986 A1 | 7/2004 | Kobayashi et al. |
| 2004/0129988 A1 | 7/2004 | Rotondaro et al. |
| 2004/0173918 A1 | 9/2004 | Kamal et al. |
| 2004/0183091 A1 | 9/2004 | Hibino |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0227198 A1 | 11/2004 | Mitani et al. |
| 2004/0251489 A1 | 12/2004 | Jeon et al. |
| 2005/0026637 A1 | 2/2005 | Fischer et al. |
| 2005/0056892 A1 | 3/2005 | Seliskar |
| 2005/0062098 A1 | 3/2005 | Mahajani et al. |
| 2005/0070126 A1 | 3/2005 | Senzaki |
| 2005/0079659 A1 | 4/2005 | Duan et al. |
| 2005/0088889 A1 | 4/2005 | Lee et al. |
| 2005/0093054 A1 | 5/2005 | Jung |
| 2005/0098839 A1 | 5/2005 | Lee et al. |
| 2005/0110064 A1 | 5/2005 | Duan et al. |
| 2005/0116279 A1 | 6/2005 | Koh |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0227501 A1 | 10/2005 | Tanabe et al. |
| 2005/0230766 A1 | 10/2005 | Nomoto et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0008959 A1 | 1/2006 | Hegemeyer et al. |
| 2006/0017092 A1 | 1/2006 | Dong et al. |
| 2006/0022252 A1 | 2/2006 | Doh et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0180851 A1 | 8/2006 | Lee et al. |
| 2006/0192248 A1 | 8/2006 | Wang |
| 2006/0202261 A1 | 9/2006 | Lue et al. |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0228907 A1 | 10/2006 | Cheng et al. |
| 2006/0237803 A1 | 10/2006 | Zhu et al. |
| 2006/0255399 A1 | 11/2006 | Kim et al. |
| 2006/0261401 A1* | 11/2006 | Bhattacharyya ...... H01L 29/792 438/266 |
| 2006/0281331 A1 | 12/2006 | Wang |

(56) References Cited

U.S. PATENT DOCUMENTS

| | | |
|---|---|---|
| 2006/0284236 A1 | 12/2006 | Bhattacharyya |
| 2007/0012988 A1 | 1/2007 | Bhattacharyya |
| 2007/0022359 A1 | 1/2007 | Katoh et al. |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |
| 2007/0121380 A1 | 5/2007 | Thomas |
| 2007/0158736 A1 | 7/2007 | Arai et al. |
| 2007/0173011 A1* | 7/2007 | Izumi .................... H10B 53/30 257/E21.664 |
| 2007/0200168 A1 | 8/2007 | Ozawa et al. |
| 2007/0202708 A1 | 8/2007 | Luo et al. |
| 2007/0210371 A1 | 9/2007 | Hisamoto et al. |
| 2007/0215940 A1 | 9/2007 | Ligon |
| 2007/0231991 A1 | 10/2007 | Willer et al. |
| 2007/0232007 A1 | 10/2007 | Forbes |
| 2007/0246753 A1 | 10/2007 | Chu et al. |
| 2007/0262451 A1 | 11/2007 | Rachmady et al. |
| 2007/0267687 A1 | 11/2007 | Lue |
| 2007/0268753 A1 | 11/2007 | Lue et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0029399 A1 | 2/2008 | Tomita |
| 2008/0048237 A1 | 2/2008 | Iwata |
| 2008/0054346 A1 | 3/2008 | Saitoh et al. |
| 2008/0057644 A1 | 3/2008 | Kwak et al. |
| 2008/0087942 A1 | 4/2008 | Hsu et al. |
| 2008/0087946 A1 | 4/2008 | Hsu et al. |
| 2008/0093661 A1 | 4/2008 | Joo et al. |
| 2008/0121932 A1 | 5/2008 | Ranade |
| 2008/0135946 A1 | 6/2008 | Yan |
| 2008/0146042 A1 | 6/2008 | Kostamo et al. |
| 2008/0150003 A1 | 6/2008 | Chen et al. |
| 2008/0173928 A1 | 7/2008 | Arai et al. |
| 2008/0175053 A1 | 7/2008 | Lue et al. |
| 2008/0230853 A1 | 9/2008 | Jang et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny, Jr. et al. |
| 2008/0293254 A1 | 11/2008 | Ramkumar |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0039416 A1 | 2/2009 | Lai et al. |
| 2009/0045452 A1 | 2/2009 | Lue et al. |
| 2009/0065849 A1 | 3/2009 | Noda |
| 2009/0152620 A1 | 6/2009 | Matsuo et al. |
| 2009/0152621 A1 | 6/2009 | Polishchuk et al. |
| 2009/0179253 A1 | 7/2009 | Levy et al. |
| 2009/0206385 A1 | 8/2009 | Kim et al. |
| 2009/0227116 A1 | 9/2009 | Joo et al. |
| 2009/0242969 A1 | 10/2009 | Tanaka |
| 2009/0294828 A1 | 12/2009 | Ozawa et al. |
| 2009/0294836 A1 | 12/2009 | Kiyotoshi |
| 2009/0294844 A1 | 12/2009 | Tanaka et al. |
| 2009/0302365 A1 | 12/2009 | Bhattacharyya |
| 2010/0006922 A1 | 1/2010 | Matsuoka et al. |
| 2010/0041222 A1 | 2/2010 | Puchner et al. |
| 2010/0096687 A1 | 4/2010 | Balseanu et al. |
| 2010/0117138 A1 | 5/2010 | Huerta et al. |
| 2010/0117139 A1 | 5/2010 | Lue et al. |
| 2010/0155823 A1 | 6/2010 | Lue et al. |
| 2010/0178759 A1 | 7/2010 | Kim et al. |
| 2010/0252877 A1 | 10/2010 | Nakanishi et al. |
| 2010/0270609 A1 | 10/2010 | Olsen et al. |
| 2010/0283097 A1 | 11/2010 | Endoh et al. |
| 2010/0295118 A1 | 11/2010 | Bhattacharya |
| 2011/0018053 A1 | 1/2011 | Lo et al. |
| 2011/0163371 A1 | 7/2011 | Song et al. |
| 2011/0233512 A1 | 9/2011 | Yang et al. |
| 2011/0237060 A1 | 9/2011 | Lee et al. |
| 2011/0248332 A1 | 10/2011 | Levy et al. |
| 2012/0007167 A1 | 1/2012 | Hung et al. |
| 2012/0061744 A1 | 3/2012 | Hwang et al. |
| 2012/0068159 A1 | 3/2012 | Fujiki et al. |
| 2012/0068250 A1 | 3/2012 | Ino et al. |
| 2012/0068255 A1 | 3/2012 | Lee et al. |
| 2013/0175604 A1 | 7/2013 | Polishchuk et al. |
| 2013/0309826 A1 | 11/2013 | Ramkumar et al. |
| 2014/0264551 A1 | 9/2014 | Polishchuk et al. |
| 2016/0300724 A1 | 10/2016 | Levy et al. |

FOREIGN PATENT DOCUMENTS

| | | |
|---|---|---|
| CN | 1801478 A | 7/2006 |
| CN | 1832201 A | 9/2006 |
| CN | 101558481 A | 10/2009 |
| CN | 101859702 A | 10/2010 |
| CN | 102142454 A | 8/2011 |
| CN | 101517714 B | 9/2012 |
| CN | 104254921 A | 12/2014 |
| JP | 2000173287 A | 6/2000 |
| JP | 2002261175 A | 9/2002 |
| JP | 2004172616 A | 6/2004 |
| JP | 2005183940 A | 7/2005 |
| JP | 2005347679 A | 12/2005 |
| JP | 2006277082 A | 10/2006 |
| JP | 2007515060 A | 6/2007 |
| JP | 2007318112 A | 12/2007 |
| JP | 2009535800 A | 10/2009 |
| JP | 2009260070 A | 11/2009 |
| JP | 2009272348 A | 11/2009 |
| JP | 201040997 A | 6/2010 |
| JP | 2010140997 A | 6/2010 |
| JP | 2010182939 A | 8/2010 |
| JP | 2011035228 A | 2/2011 |
| JP | 2011507231 A | 3/2011 |
| JP | 2011527824 A | 11/2011 |
| JP | 2012004249 A | 1/2012 |
| KR | 20040070669 A | 8/2004 |
| KR | 20060100092 A | 9/2006 |
| KR | 20110093746 A | 8/2011 |
| TW | 200703671 A | 1/2007 |
| TW | 200847343 A | 12/2008 |
| WO | 2007064048 A1 | 6/2007 |
| WO | 2008129478 A1 | 10/2008 |
| WO | 2011162725 A1 | 12/2011 |
| WO | 2013148112 A1 | 10/2013 |
| WO | 2013148343 A1 | 10/2013 |

OTHER PUBLICATIONS

AMD, "Am99C10A 256 x 48 Content Addressable Memory", Advanced Micro Devices, Dec. 1992, pp. 1-26.

Agilent, "Agilent ADNK-2030 Solid-State Optical Mouse Sensor" Sample Kit, Agilent Technologies, Mar. 10, 2003, p. 1-1.

Agilent, ADNS-2030—High-performance, Low Power Optical Mouse Sensor (Optimized for Cordless Mouse Applications), Agilent Technologies, Mar. 10, 2003, pp. 1-2.

Agilent, "Agilent ADNS-2030 Low Power Optical Mouse Sensor" Data Sheet, Agilent Technologies, May 11, 2005, pp. 1-34.

Agilent, "ADNS-2051—High-performance Optical Mouse Sensor", Agilent Technologies, Oct. 10, 2005, pp. 1-2.

Agilent, "Agilent ADNS-2051 Optical Mouse Sensor", Product Overview, Agilent Technologies, Mar. 31, 2003, pp. 1-2.

Agilent, "Agilent Optical Mouse Sensor", Selection Guide, Agilent Technologies, Nov. 3, 2004, pp. 1-3.

Altera, "MAX 9000 Programmable Logic Device Family", Data Sheet, Altera Corporation, Ver. 6.01, Jul. 1999, pp. 1-41.

(56) References Cited

OTHER PUBLICATIONS

Alvarez et al., "A Wide-Bandwidth Low-Voltage PLL for PowerPC Microprocessors", IEEE journal of Solid-State Circuits, vol. 30, No. 4, Apr. 1995, pp. 37-38.
Anderson et al., "A Single Chip Sensor & Image Processor for Figerprint Verification", IEEE 1991 Custom Integrated Circuits Conference, May 12-15, 1991, p. 12.1.1-12.1.4.
Carley, "Trimming Analog Ciruits Using Floating-Gate Analog MOS Memory", IEEE journal of Solid-State Circuits, vol. 24, No. 6, Dec. 1989, pp. 1569-1575.
Chen et al., "Performance Improvement of Sonos Memory by Bandgap Engineering of Charge-Trapping Layer", IEEE Electron Device Letters, vol. 25, No. 4, Apr. 2004, pp. 205-207.
Chien et al., "Two-bit Sonos type Flash using a band engineering in the nitride layer", ScienceDirect, Microelectronic Engineering, vol. 80, Jun. 17, 2005, pp. 1-2.
Cho et al., "A Novel Robust and Low Cost Stack Chips Package and Its Thermal Performance", IEEE Transactions on Advanced Packaging, vol. 23, No. 2, May 2000, pp. 257-265.
Cuppens et al., "An EEPROM for Microprocessors and Custom Logic", IEEE Journal of Solid-State Circuits, vol. sc-20, No. 2, Apr. 1985, pp. 603-608.
Cypress, "1.8V, 500-MHz, 10-Output JEDEC-Compliant Zero Delay Buffer", CY2SSTU877, Cypress Advance Information, Cypress Semiconductor Corporation, Document #: 38-07575 Ref. *A, Revised Feb. 12, 2004, pp. 1-9.
Cypress, "1K x 8 Dual-Port Static Ram", CY7C130/CY7C131and CY7C140/CY7C141, Cypress Semiconductor Corporation, May 1989—Revised Mar. 27, 1997, pp. 1-16.
Cypress, "2K x 8 Dual-Port Static RAM", Cypress Semiconductor Data Book, CY7C132/CY7C136 and CY7C142/CY7C146, Cypress Semiconductor Corporation, May 1995, pp. 6:50-6:62.
Cypress, "2K x 16 Dual-Port Static RAM," Cypress Semiconductor Data Book, CY7C133 and CY7C143, Cypress Semiconductor Corporation, May 1995, pp. 1-62.
Cypress, "3.3V 64K x 18 Synchronous QuadPort Statis RAM", Cypress Preliminary, CY7C0430BV, Cypress Semiconductor, Mar. 27, 2001, pp. 1-36.
Cypress, "16K x 8/9 Dual-Port Static RAM with Sem, Int, Busy," Cypress Semiconductor Data Book, CY7C006 and CY7C016, May 1995, pp. 1-16.
Cypress, "200-MBaud HOTLink Transceiver," Cypress Semiconductor Corporation, CY7C924ADX, Document #38-02008 Rev. *G; pp. 1-62.
Duvvury et al., "Achieving Uniform nMOS Device Power Distribution for Sub-micron ESD Reliability;" Texas Instruments Incorporated Semiconductor Process and Design Center, IEEE Journal of Solid-State Circuits, 1992 (no month), pp. 6.1.1-6.1.4.
Hung et al., "High-performance gate-all-around polycrystalline silicon nanowire with silicon nanocrystals nonvolatile memory", Applied Physics letters 98 162108 (2011), American Institute of Physics, Apr. 22, 2011, pp. 1-4.
IBM, "Algorithm for Managing Multiple First-In, First-Out Queues from a Single Shared Random-Access Memory," IBM Technical Disclosure Bulletin, Aug. 1, 1989, pp. 1-5.
Kazerounian et al., "A Single Poly EPROM for Custom CMOS Logic Applications", IEEE 1986 Custom Integrated Circuits Conference, pp. 59-62.
Linear, "1kHz to 30MHz Resistor Set SOT-23 Oscillator", Initial Release Final Electrical Specifications LTC 1799, Linear Technology Corporation, Jan. 2001, pp. 1-4.
Lue et al., "Be-Sonos: A Bandgap Engineered Sonos with Excellent Performance and Reliability", Emerging Central Lab, Technology Development Center, Macronix International Co. Ltd., IEEE, Aug. 2005, pp. 1-4.
Lue et al., "Reliability Model of Bandgap Engineered Sonos (Be-Sonos)", Emerging Central Lab, Technology Development Center, Macronix International Co. Ltd., IEEE, Aug. 2006, pp. 1-4.
Miyamoto et al., "An Experimental 5-V-Only 256-kbit CMOS EEPROM with a High-Performance Single-Polysilicon Cell", IEEE Journal of Solid-State Circuits, vol. sc-21, No. 5, Oct. 1986, pp. 852-860.
Ohring, "Materials Science of Thin Films—Deposition and Structure", Second Ed. pp. 336-337, Academic Press, 2002 (no month) pp. 1-4.
Ohsaki et al., "A Planar Type EEPROM Cell Structure by Standard CMOS Process for Integration with Gate Array, Standard Cell, Microprocessor and for Neural Chips", Advanced System Dev., Component Technology, IBM Japan, IEEE Custom Integrated Circuits Conference, 1993 (no month), pp. 23.6.1-23.6.4.
Ramkumar, "Floating Gate Flash Memory Technology", Cypress Semiconductor White Paper, Cypress Sonos Technology, Jul. 6, 2011, p. 1-9.
SMaL, "Ultra-Pocket 5 Kit", SMal Camera Technologies, SMal Products, Aug. 25, 2005, pp. 1-3.
Sun, "An Analog PLL-Based Clock and Data Recovery Circuit with High Input Jitter Tolerance", IEEE Journal of Solid-State Circuits, vol. 24, No. 2, Apr. 1989, pp. 325-330.
Takebuchi et al., "A Novel Integration Technology of EEPROM Embedded CMOS Logic VLSI Suitable for ASIC Applications", IEEE 1992 Custom Integrated Circuits Conference, 1992 (no month), pp. 9.6.1-9.6.4.
Wang et al., "Reliability and Processing Effects of Bandgap Engineered Sonos (Be_Sonos) Flash Memory", IEEE Transactions of Device and Material Reliability, vol. 8, Issue 2, Jun. 10, 2008, pp. 703-707.
Wu et al., "Sonos Device with Tampered Bandgap Nitride Layer", IEEE Transactions on Electron Devices, vol. 52, No. 5, May 2005, pp. 987-992.
Yang et al., "Reliability considerations in scaled Sonos nonvolatile memory devices", Solid-State Electornics 43, Elsevier Science Ltd., Pergamon, 1999 (no month), pp. 2025-2032.
Yoshikawa, et al., "An EPROM Cell Structure for EPLDs Compatible with Single Poly Gate Process" By Kuniyushi Yoshikawa et al., Extended Abstracts of the 18th (1986 International) Conference on Solid State Devices and Materials, Tokyo, 1986, pp. 675-679.

* cited by examiner

OXIDE-NITRIDE-OXIDE STACK HAVING MULTIPLE OXYNITRIDE LAYERS

CROSS-REFERENCE TO RELATED APPLICATIONS

This application is a divisional of U.S. application Ser. No. 17/157,704, filed Jan. 25, 2021, which is a continuation of U.S. application Ser. No. 15/099,025, filed April 14, 2016, which is a continuation of U.S. application Ser. No. 13/917,500, filed Jun. 13, 2013, now U.S. Pat. No. 9,355,849 issued on May 31 2016, which is a continuation of U.S. patent application Ser. No. 11/811,958, filed Jun. 13, 2007, which claims priority to U.S. Provisional Patent Application 60/931,947, filed May 25, 2007, all of which are incorporated by reference herein in their entirety.

TECHNICAL FIELD

This invention relates to semiconductor processing and, more particularly to an oxide-nitride-oxide stack having an improved oxide-nitride or oxynitride layer and methods of forming the same.

BACKGROUND OF THE INVENTION

Non-volatile semiconductor memories, such as a split gate flash memory, typically use a stacked floating gate type field effect transistors, in which electrons are induced into a floating gate of a memory cell to be programmed by biasing a control gate and grounding a body region of a substrate on which the memory cell is formed.

An oxide-nitride-oxide (ONO) stack is used as either a charge storing layer, as in silicon-oxide-nitride-oxide-silicon (SONOS) transistor, or as an isolation layer between the floating gate and control gate, as in a split gate flash memory.

FIG. 1 is a partial cross-sectional view of an intermediate structure for a semiconductor device 100 having a SONOS gate stack or structure 102 including a conventional ONO stack 104 formed over a surface 106 of a silicon substrate 108 according to a conventional method. In addition, the device 100 typically further includes one or more diffusion regions 110, such as source and drain regions, aligned to the gate stack and separated by a channel region 112. Briefly, the SONOS structure 102 includes a poly-silicon (poly) gate layer 114 formed upon and in contact with the ONO stack 104. The poly gate 114 is separated or electrically isolated from the substrate 108 by the ONO stack 104. The ONO stack 104 generally includes a lower oxide layer 116, a nitride or oxynitride layer 118 which serves as a charge storing or memory layer for the device 100, and a top, high-temperature oxide (HTO) layer 120 overlying the nitride or oxynitride layer.

One problem with conventional SONOS structures 102 and methods of forming the same is the poor data retention of the nitride or oxynitride layer 118 that limits the device 100 lifetime and/or its use in several applications due to leakage current through the layer.

Another problem with conventional SONOS structures 102 and methods of forming the same is the stochiometry of the oxynitride layer 118 is neither uniform nor optimized across the thickness of the layer. In particular, the oxynitride layer 118 is conventionally formed or deposited in a single step using a single process gas mixture and fixed or constant processing conditions in an attempt to provide a homogeneous layer having a high nitrogen and high oxygen concentration across the thickness of the relatively thick layer. However, due to top and bottom effects this results in nitrogen, oxygen and silicon concentrations, which can vary throughout the conventional oxynitride layer 118. The top effect is caused by the order in which process gases are shut off following deposition. In particular, the silicon containing process gas, such as silane, is typically shut off first resulting in a top portion of the oxynitride layer 118 that is high in oxygen and/or nitride and low in silicon. Similarly, the bottom effect is caused by the order in which process gases are introduced to initiate deposition. In particular, the deposition of the oxynitride layer 118 typically follows an annealing step, resulting in a peak or relatively high concentration of ammonia ($NH_3$) at the beginning of the deposition process and producing in a bottom portion of the oxynitride layer that is low in oxygen and silicon and high in nitrogen. The bottom effect is also due to surface nucleation phenomena in which that oxygen and silicon that is available in the initial process gas mixture preferentially reacts with silicon at the surface of the substrate and does not contribute to the formation of the oxynitride layer. Consequently, the charge storage characteristics, and in particular programming and erase speed and data retention of a memory device 100 made with the ONO stack 104, are adversely effected.

Accordingly, there is a need for a memory device having an ONO stack with an oxynitride layer as a memory layer that exhibits improved programming and erase speed and data retention. There is a further need for a method or process of forming an ONO stack having an oxynitride layer that exhibits improved oxynitride stochiometry.

The present invention provides a solution to these and other problems, and offers further advantages over conventional ONO stacks or memory layers and methods of forming the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1:
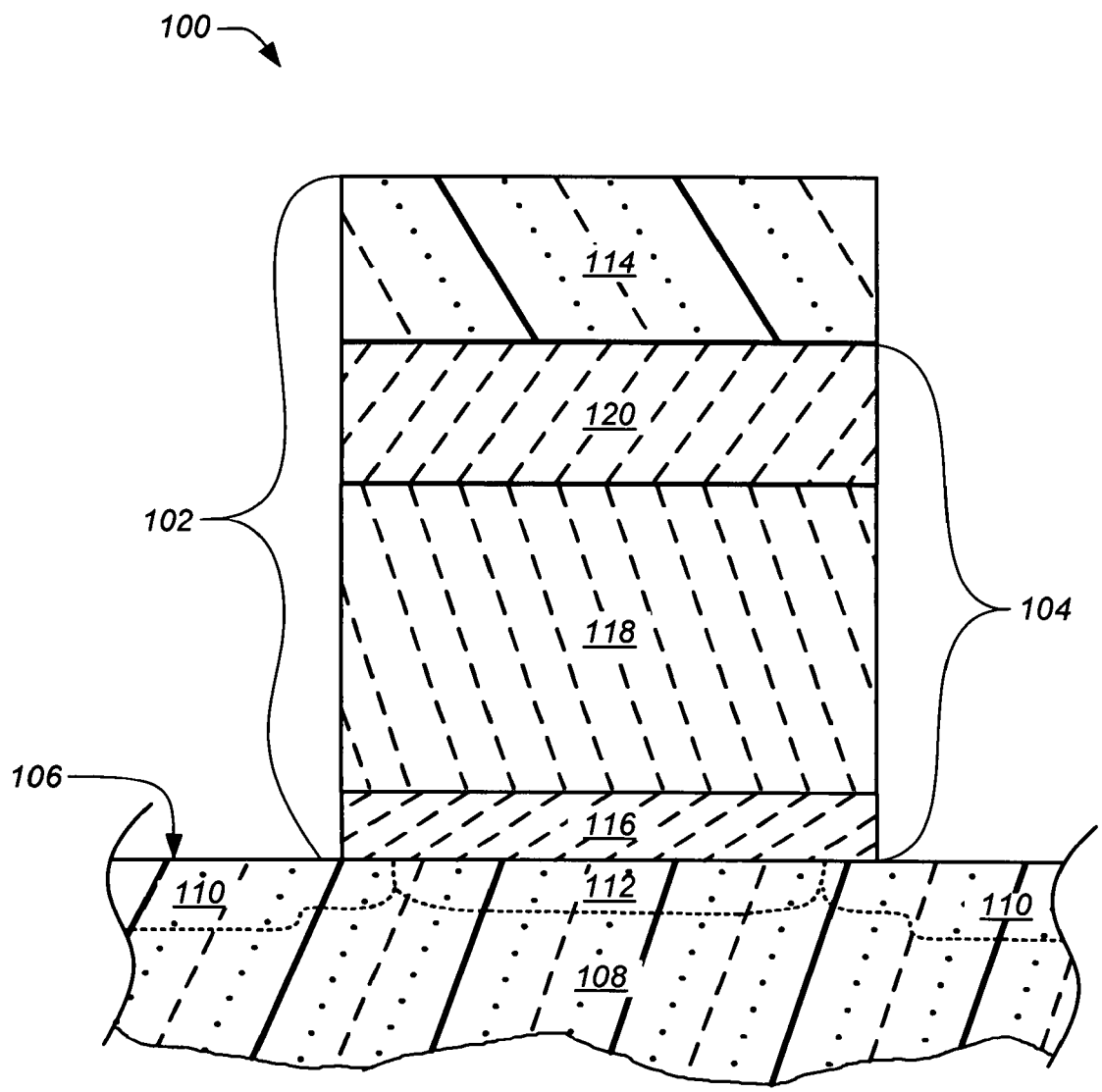
FIG. 1 (prior art) is a block diagram illustrating a cross-sectional side view of an intermediate structure for a memory device for which a method having an oxide-nitride-oxide (ONO) stack formed according to conventional method.

The present invention is directed generally to an oxide-nitride-oxide (ONO) structure including a multi-layer charge storing layer and methods for making the same. The ONO structure and method are particularly useful for forming a memory layer in a memory device, such as a silicon-oxide-nitride-oxide-silicon (SONOS) memory transistor.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, the method involves forming a multi-layer charge storing layer including multiple oxynitride layers, such as silicon oxynitride ($Si_2N_2O$) layers, having differing concentrations of Oxygen, Nitrogen and/or Silicon. Generally, the oxynitride layers are formed at higher temperatures than nitride or oxynitride layers in conventional ONO structures, and each of the layers are formed using differing process gases mixtures and/or at differing flow rates. Preferably, the oxynitride layers include at least a top oxynitride layer and a bottom oxynitride layer. More preferably, the stochiometric compositions of the layers is tailored or selected such that the lower or bottom oxynitride has a high oxygen and silicon content, and the top oxynitride layer has high silicon and a high nitrogen concentration with a low oxygen concentration to produce a silicon-rich nitride or oxynitride. The silicon-rich and oxygen-rich bottom oxynitride layer reduces stored charge loss without compromising device speed or an initial (beginning of life) difference between program and erase voltages. The silicon-rich, oxygen-lean top oxynitride layer increases a difference between programming and erase voltages of memory devices, thereby improving device speed, increasing data retention, and extending the operating life of the device.

Optionally, the ratio of thicknesses between the top oxynitride layer and the bottom oxynitride layer can be selected to facilitate forming of the oxynitride layers over a first oxide layer of an ONO structure following the step of forming the first oxide layer using a steam anneal.

An ONO structure and methods for fabricating the same according to various embodiments of the present invention will now be described in greater detail with reference to FIGS. 2 through 4.

Figure 2:
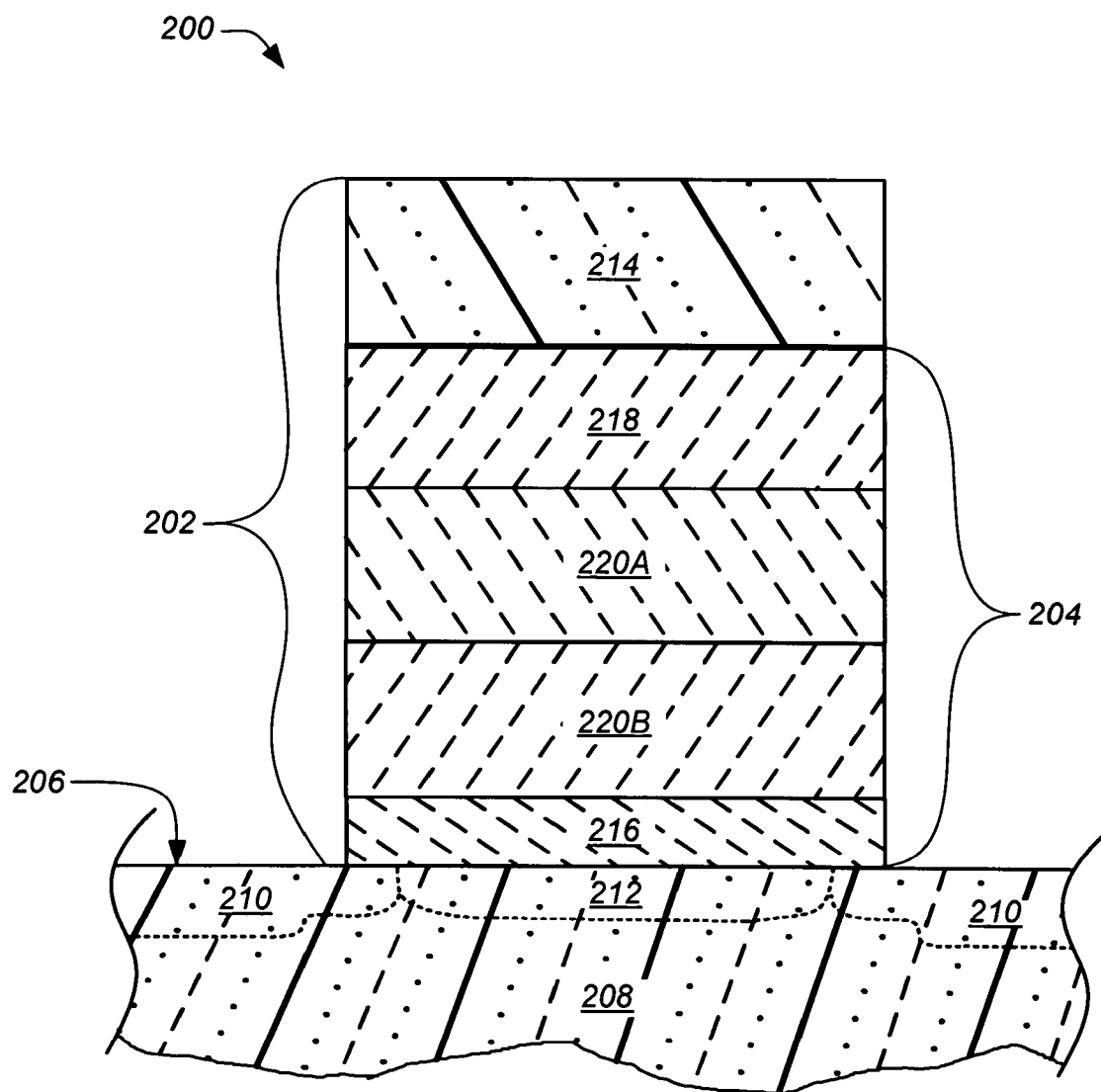
FIG. 2 is a block diagram illustrating a cross-sectional side view of a portion of a semiconductor device having an ONO structure including a multi-layer charge storing layer according to an embodiment of the present invention.

FIG. 2 is a block diagram illustrating a cross-sectional side view of a portion of a semiconductor memory device 200 having an ONO structure including a multi-layer charge storing layer according to one embodiment of the present invention. Referring to FIG. 2, the memory device 200 includes a SONOS gate stack 202 including an ONO structure 204 formed over a surface 206 of silicon layer on a substrate or a silicon substrate 208. In addition, the device 200 further includes one or more diffusion regions 210, such as source and drain regions, aligned to the gate stack 202 and separated by a channel region 212. Generally, the SONOS structure 202 includes a poly-silicon or poly gate layer 214 formed upon and in contact with the ONO structure 204 and a portion of the silicon layer or substrate 208. The poly gate 214 is separated or electrically isolated from the substrate 208 by the ONO structure 204. The ONO structure 204 includes a thin, lower oxide layer or tunneling oxide layer 216 that separates or electrically isolates the gate stack 202 from the channel region 212, a top or blocking oxide layer 218, and a multi-layer charge storing layer including multiple nitride containing layers. Preferably, as noted above and as shown in FIG. 2, the multi-layer charge storing layer includes at least two oxynitride layers, including a top oxynitride layer 220A and a bottom oxynitride layer 220B.

Generally, the substrate 208 may include any known silicon-based semiconductor material including silicon, silicon-germanium, silicon-on-insulator, or silicon-on-sapphire substrate. Alternatively, the substrate 208 may include a silicon layer formed on a non-silicon-based semiconductor material, such as gallium-arsenide, germanium, gallium-nitride, or aluminum-phosphide. Preferably, the substrate 208 is a doped or undoped silicon substrate.

The lower oxide layer or tunneling oxide layer 216 of the ONO structure 204 generally includes a relatively thin layer of silicon dioxide ($SiO_2$) of from about 15 angstrom (Å) to about 22 Å, and more preferably about 18 Å. The tunneling oxide layer 216 can be formed or deposited by any suitable means including, for example, being thermally grown or deposited using chemical vapor deposition (CVD). In a preferred embodiment, the tunnel oxide layer is formed or grown using a steam anneal. Generally, the process involves a wet-oxidizing method in which the substrate 208 is placed in a in a deposition or processing chamber, heated to a temperature from about 700° C. to about 850° C., and exposed to a wet vapor for a predetermined period of time selected based on a desired thickness of the finished tunneling oxide layer 216. Exemplary process times are from about 5 to about 20 minutes. The oxidation can be performed at atmospheric or at low pressure.

As noted above, the multi-layer charge storing layer generally includes at least two oxynitride layers having differing compositions of silicon, oxygen and nitrogen, and can have an overall thickness of from about 70 Å to about 150 Å, and more preferably about 100 Å. In a preferred embodiment the oxynitride layers are formed or deposited in a low pressure CVD process using a silicon source, such as silane ($SiH_4$), chlorosilane ($SiH_3Cl$), dichlorosilane ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or bottom oxynitride layer 220B can be deposited over the tunneling oxide layer 216 by placing the substrate 208 in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, bottom oxynitride layer 220B, that decrease the charge loss rate after programming and after erase, which is manifested in a small voltage shift in the retention mode.

The top oxynitride layer 220A can be deposited over the bottom oxynitride layer 220B in a CVD process using a process gas including $N_2O$, $NH_3$ and DCS, at a chamber pressure of from about 5 mT to about 500 mT, and at a substrate temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean top oxynitride layer 220A, which improves the speed and increases of the initial difference between program and erase voltage without compromising a charge loss rate of memory devices made using an embodiment of the inventive ONO structure 204, thereby extending the operating life of the device.

Preferably, the top oxynitride layer 220A is deposited sequentially in the same tool used to form the bottom oxynitride layer 220B, substantially without breaking vacuum on the deposition chamber. More preferably, the top oxynitride layer 220A is deposited substantially without altering the temperature to which the substrate 208 was heated during deposition of the bottom oxynitride layer 220B. In one embodiment, the top oxynitride layer 220A is deposited sequentially and immediately following the deposition of the bottom oxynitride layer 220B by decreasing the flow rate of the $N_2O$/$NH_3$ gas mixture relative to the DCS/$NH_3$ gas mixture to provide the desired ratio of the gas mixtures to yield the silicon-rich, nitrogen-rich, and oxygen-lean top oxynitride layer 220A.

In certain embodiments, another oxide or oxide layer (not shown in these figures) is formed after the formation of the ONO structure 204 in a different area on the substrate or in the device using a steam oxidation. In this embodiment, the top oxynitride layer 220A and top oxide layer 218 of the ONO structure 204 are beneficially steam annealed during the steam oxidation process. In particular, steam annealing improves the quality of the top oxide layer 218 reducing the number of traps formed near a top surface of the top oxide layer and near a top surface of the underlying top oxynitride layer 220A, thereby reducing or substantially eliminating an electric field that could otherwise form across the top oxide layer, which could result in back streaming of charge carriers therethrough and adversely affecting data or charge retention in the charge storing layer.

A suitable thickness for the bottom oxynitride layer 220B has been found to be from about 10 Å to about 80 Å, and a ratio of thicknesses between the bottom layer and the top oxynitride layer has been found to be from about 1:6 to about 6:1, and more preferably at least about 1:4.

The top oxide layer 218 of the ONO structure 204 includes a relatively thick layer of $SiO_2$ of from about 30 Å to about 70 Å, and more preferably about 45 Å. The top oxide layer 218 can be formed or deposited by any suitable means including, for example, being thermally grown or deposited using CVD. In a preferred embodiment, the top oxide layer 218 is a high-temperature-oxide (HTO) deposited using CVD process. Generally, the deposition process involves exposing the substrate 208 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

Preferably, the top oxide layer 218 is deposited sequentially in the same tool used to form the oxynitride layers 220A, 220B. More preferably, the oxynitride layers 220A, 220B, and the top oxide layer 218 are formed or deposited in the same tool used to grow the tunneling oxide layer 216. Suitable tools include, for example, an ONO AVP, commercially available from AVIZA technology of Scotts Valley, California.

A method or forming or fabricating an ONO stack according to one embodiment of the present invention will now be described with reference to the flowchart of FIG. 3.

Figure 3:
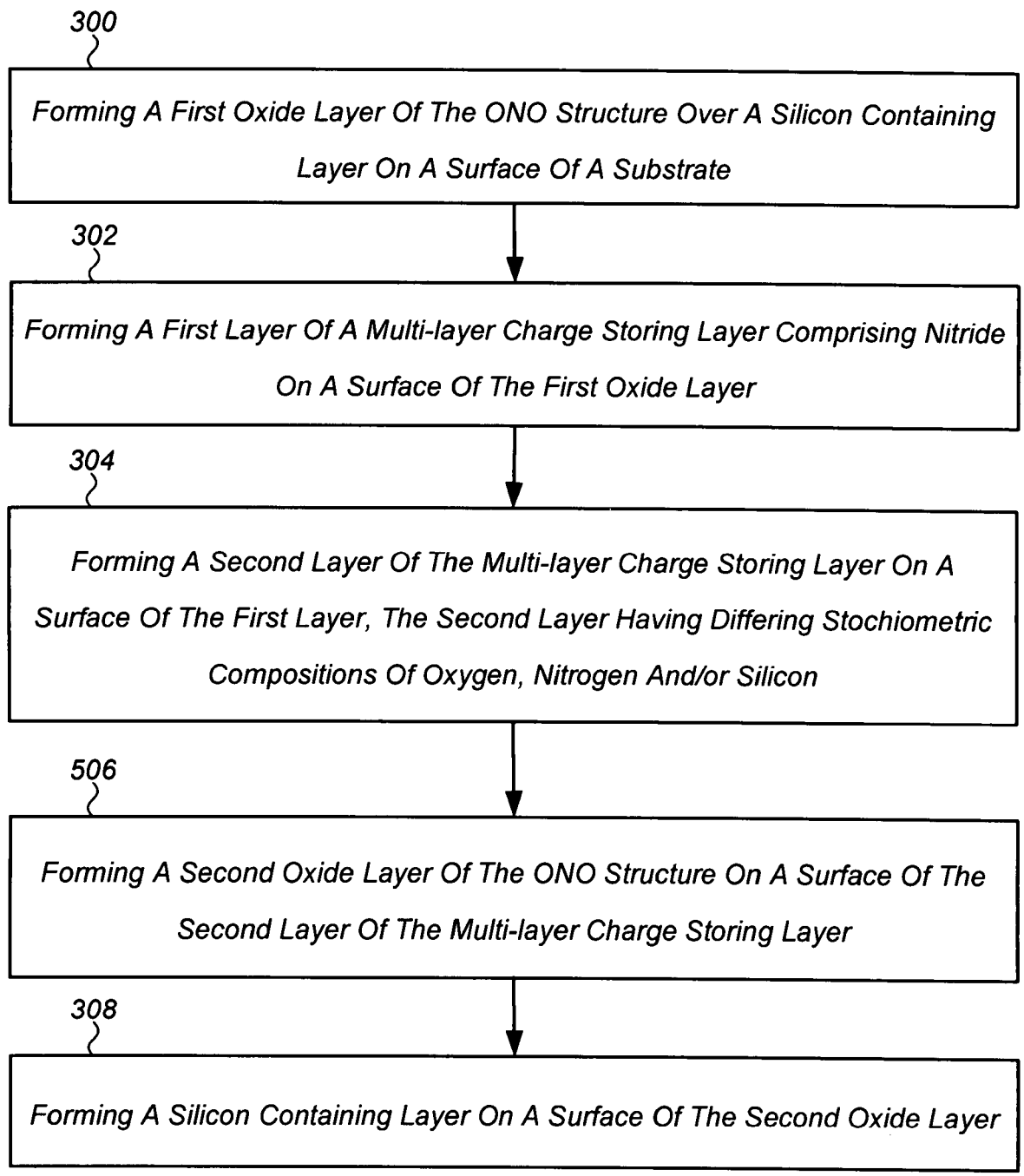
FIG. 3 is flow chart of a method for forming an ONO structure including a multi-layer charge storing layer according to an embodiment of the present invention.

Referring to FIG. 3, the method begins with forming a first oxide layer, such as a tunneling oxide layer, of the ONO structure over a silicon containing layer on a surface of a substrate (step 300). Next, the first layer of a multi-layer charge storing layer including nitride is formed on a surface of the first oxide layer (step 302). As noted above, this first layer or bottom oxynitride layer can be formed or deposited by a CVD process using a process gas including $N_2O$/$NH_3$ and DCS/$NH_3$ gas mixtures in ratios and at flow rates tailored to provide a silicon-rich and oxygen-rich oxynitride layer. The second layer of the multi-layer charge storing layer is then formed on a surface of the first layer (step 304). The second layer has a stochiometric composition of oxygen, nitrogen and/or silicon different from that of the first layer. In particular, and as noted above, the second or top oxynitride layer can be formed or deposited by a CVD process using a process gas including DCS/$NH_3$ and $N_2O$/$NH_3$ gas mixtures in ratios and at flow rates tailored to provide a silicon-rich, oxygen-lean top oxynitride layer. Finally, a second oxide layer of the ONO structure is formed on a surface of the second layer of the multi-layer charge storing layer (step 306). As noted above, this top or blocking oxide layer can be formed or deposited by any suitable means, but is preferably deposited in a CVD process. In one embodiment the top or second oxide layer is a high temperature oxide deposited in a HTO CVD process. Alternatively, the top or blocking oxide layer can be thermally grown, however it will be appreciated that in this embodiment the oxynitride thickness must be adjusted or increased as some of the top oxynitride will be effectively consumed or oxidized during the process of thermally growing the blocking oxide layer.

Optionally, the method may further include the step of forming or depositing a silicon containing layer on a surface of the second oxide layer to form a SONOS stack or structure (step 308). The silicon containing layer can be, for example, a polysilicon layer deposited by a CVD process to form a control gate of a SONOS transistor or device.

A comparison of data retention for a memory device using a memory layer formed according to an embodiment of the present invention as compared to a memory device using a conventional memory layer will now be made with reference to FIG. 4. In particular, FIG. 4 illustrates the change in threshold voltage of devices in an electronically erasable programmable read-only memory (EEPROM) during programming (VTP) during erase (VTE) over device life for an EEPROM made using a conventional ONO structure and an ONO structure having a multi-layer oxynitride layer. In gathering data for this figure both devices were pre-cycled for 100K cycles at an ambient temperature of 85° C.

Figure 4:
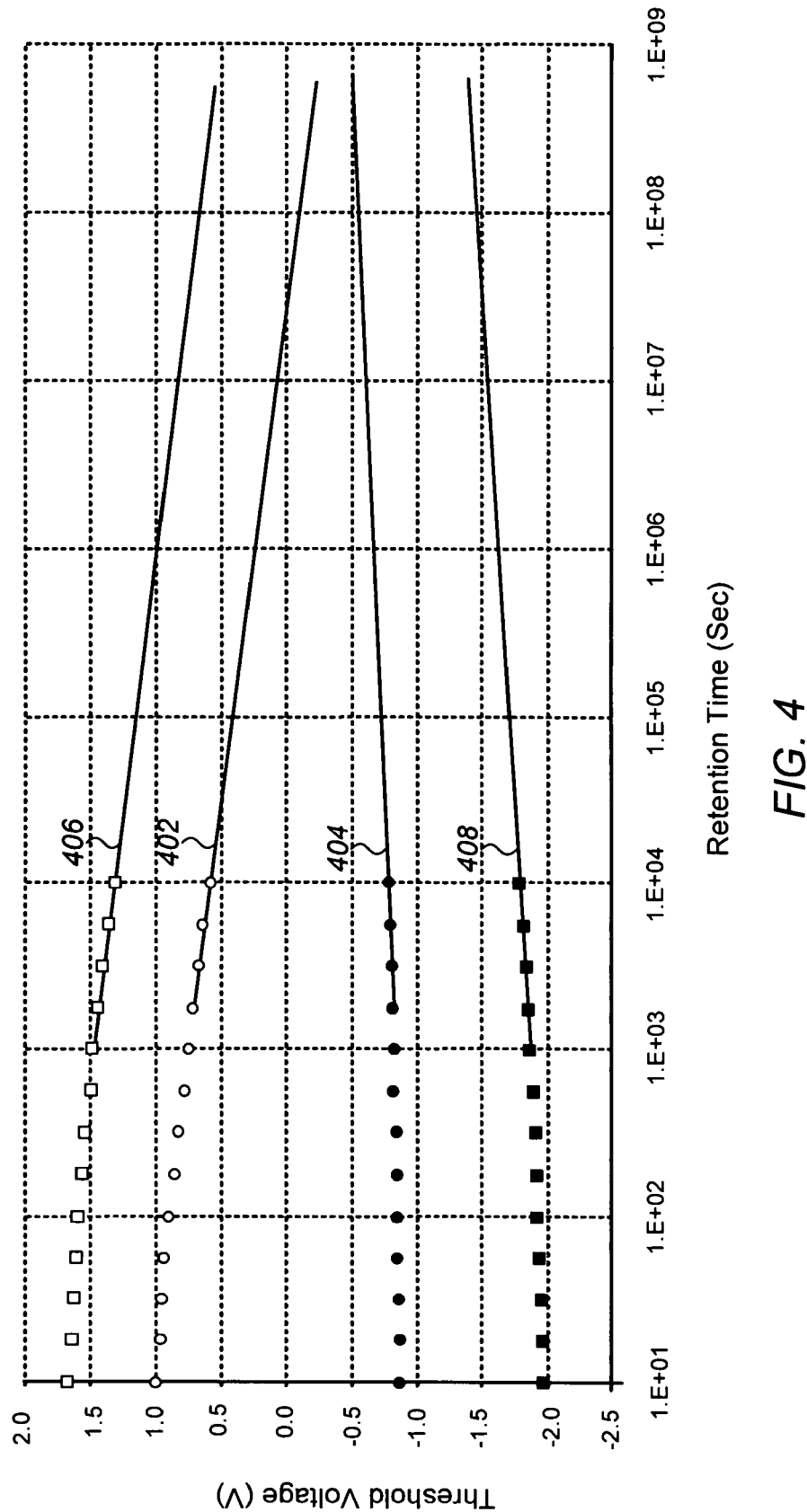
FIG. 4 is a graph showing an improvement in data retention for a memory device using a memory layer formed according to the present invention as compared to a memory device using a conventional memory layer.

Referring to FIG. 4, the graph or line 402 illustrates the change over time of a VTP for an EEPROM made using a conventional ONO structure having a single oxynitride layer without refreshing the memory after the initial writing—program or erase. Actual data points on line 402 are shown by unfilled circles, the remainder of the line showing an extrapolation of VTP to a specified end-of-life (EOL) for the EEPROM. Graph or line 404 illustrates the change over time of a VTE for the EEPROM made using a conventional ONO structure. Actual data points on line 404 are shown by filled circles, and the remainder of the line shows an extrapolation of VTE to EOL for the EEPROM. Generally, the specified difference between the VTE and VTP for an EEPROM at EOL is at least 0.5 V to be able to identify or sense the difference between the program and erase state. As seen from this figure an EEPROM made using a conventional ONO structure has a difference between VTE and VTP of about 0.35V at a specified EOL of 20 years. Thus, an EEPROM made using a conventional ONO structure and operated under the conditions described above will fail to meet the specified operating life by at least about 17 years.

In contrast, the change in VTP and VTE over time for an EEPROM made using an ONO structure having a multi-layer oxynitride layer, illustrated by lines 406 and 408 respectively, shows a difference between VTE and VTP of at least about 1.96V at the specified EOL. Thus, an EEPROM made using an ONO structure according to an embodiment of the present invention will meet and exceed the specified operating life of 20 years. In particular, graph or line 406 illustrates the change over time of VTP for an EEPROM using an ONO structure according to an embodiment of the present invention. Actual data points on line 406 are shown by unfilled squares, the remainder of the line showing an extrapolation of VTP to the specified EOL. Graph or line 408 illustrates the change over time of VTE for the EEPROM, and actual data points on line 408 are shown by filled squares, the remainder of the line showing an extrapolation of VTE to EOL.

Although shown and described above as having only two oxynitride layer, i.e., a top and a bottom layer, the present invention is not so limited, and the multi-layer charge storing layer can include any number, n, of oxynitride layers, any or all of which may have differing stoichiometric compositions of oxygen, nitrogen and/or silicon. In particular, multi-layer charge storing layers having up to five oxynitride layers each with differing stoichiometric compositions have been produced and tested. However, as will be appreciated by those skilled in the art it is generally desirable to utilize as few layers as possible to accomplish a desired result, reducing the process steps necessary to produce the device, and thereby providing a much simpler and more robust manufacturing process. Moreover, utilizing as few layers as possible also results in higher yields as it is simpler to control the stoichiometric composition and dimensions of the fewer layers.

It will further be appreciated that although shown and described as part of a SONOS stack in a SONOS memory device, the ONO structure and method of the present invention is not so limited, and the ONO structure can be used in or with any semiconductor technology or in any device requiring a charge storing or dielectric layer or stack including, for example, in a split gate flash memory, a TaNOS stack, in a 1 T (transistor) SONOS cell, a 2 T SONOS cell, a 3 T SONOS cell, a localized 2-bit cell, and in a multilevel programming or cell, without departing from the scope of the invention.

The advantages of ONO structures and methods of forming the same according to an embodiment of the present invention over previous or conventional approaches include: (i) the ability to enhance data retention in memory devices using the structure by dividing the oxynitride layer into a plurality of films or layers and tailoring the oxygen, nitrogen and silicon profile across each layer; (ii) the ability to enhance speed of a memory device without compromising data retention; (iii) the ability to meet or exceed data retention and speed specifications for memory devices using an ONO structure of an embodiment of the present invention at a temperature of at least about 125° C.; and (iv) provide heavy duty program erase cycles of 100,000 cycles or more.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A semiconductor memory device comprising: a semiconductor substrate;
an oxide-nitride-oxide structure formed over the substrate, the oxide-nitride-oxide structure having a first oxide layer, a nitride layer and a second oxide layer, the nitride layer having multiple charge storing layers that includes a first layer and a second layer, the first and the second layers being silicon oxynitride layers that have different stoichiometric compositions; and
a gate coupled to the oxide-nitride-oxide structure;
wherein the first layer of the nitride layer has a higher oxygen concentration than the second layer of the nitride layer.

2. The device of claim 1, wherein the first layer of the nitride layer was formed using a first flow rate of an oxygen containing gas mixture and the second layer of the nitride layer was formed using a second flow rate of the oxygen containing gas mixture, the second flow rate being less than the first flow rate.

3. The device of claim 1, wherein the first and the second layers have different stoichiometric compositions of silicon, oxygen, and nitrogen.

4. The device of claim 1, wherein the first layer is oxygen-rich and the second layer is oxygen-lean.

5. The device of claim 1, wherein said first oxide layer comprises a tunneling oxide layer and said second oxide layer comprises a blocking oxide layer, wherein the multiple charge storing layers are formed between the tunneling oxide layer and the blocking oxide layer.

6. The device of claim 5, wherein the first layer of the nitride layer is formed closer to the tunneling oxide layer and further from the blocking oxide layer.

7. The device of claim 6, wherein the second layer of the nitride layer is formed closer to the blocking oxide layer and the first layer of the nitride layer is formed closer to the tunneling oxide layer.

8. The device of claim 5, wherein the tunneling oxide layer is between the substrate and the first layer and wherein the blocking oxide layer is between the second layer and the gate.

9. A semiconductor memory device including a semiconductor substrate, the memory device comprising:
- an oxide-nitride-oxide structure having a first oxide layer, a nitride layer and a second oxide layer, the nitride layer having a multi-layer charge storing layer that includes a first layer and a second layer, the first and the second layers being silicon oxynitride layers that have different stoichiometric compositions; and
- a gate coupled to the oxide-nitride-oxide structure;
- wherein the first layer of the multi-layer charge storing layer of the nitride layer has a higher oxygen concentration than the second layer of the multi-layer charge storing layer.

10. The device of claim 9, wherein the first layer of the multi-layer charge storing layer was formed using a first flow rate of an oxygen containing gas mixture and the second layer of the multi-layer charge storing layer was formed using a second flow rate of the oxygen containing gas mixture, the second flow rate being less than the first flow rate.

11. The device of claim 9, wherein the first and the second layers have different stoichiometric compositions of silicon, oxygen, and nitrogen.

12. The device of claim 9, wherein the first layer is oxygen-rich and the second layer is oxygen-lean.

13. The device of claim 9, wherein said first oxide layer comprises a tunneling oxide layer and said second oxide layer comprises a blocking oxide layer, wherein the multi-layer charge storing layer is formed between the tunneling oxide layer and the blocking oxide layer.

14. The device of claim 13, wherein the first layer of the multi-layer charge storing layer is formed closer to the tunneling oxide layer and further from the blocking oxide layer.

15. The device of claim 14, wherein the second layer of the multi-layer charge storing layer is formed closer to the blocking oxide layer and the first layer of the multi-layer charge storing layer is formed closer to the tunneling oxide layer.

16. A semiconductor memory device,
comprising: a semiconductor substrate;
- an oxide-nitride-oxide structure formed over the substrate, the oxide-nitride-oxide structure having a tunnel oxide layer as part of a first oxide layer, a blocking oxide layer as part of a second oxide layer and a multi-layer charge storing layer as part of a nitride layer and formed between the tunnel oxide layer and the blocking oxide layer;
- the multi-layer charge storing layer including a first layer and a second layer, the first and the second layers being silicon oxynitride layers that have different stoichiometric compositions of silicon, oxygen, and nitrogen; and
- a gate coupled to the oxide-nitride-oxide structure;
- wherein the first layer of the multi-layer charge storing layer of the nitride layer has a higher oxygen concentration than the second layer of the multi-layer charge storing layer.

* * * * *